(12) United States Patent
Liu

(10) Patent No.: US 9,099,323 B2
(45) Date of Patent: Aug. 4, 2015

(54) SEMICONDUCTOR DEVICE AND MANUFACTURING METHOD THEREOF

(75) Inventor: Jinhua Liu, Beijing (CN)

(73) Assignee: Semiconductor Manufacturing International (Beijing) Corporation, Beijing (CN)

(*) Notice: Subject to any disclaimer, the term of this patent is extended or adjusted under 35 U.S.C. 154(b) by 851 days.

(21) Appl. No.: 13/244,054

(22) Filed: Sep. 23, 2011

(65) Prior Publication Data

US 2012/0313171 A1 Dec. 13, 2012

(30) Foreign Application Priority Data

Jun. 9, 2011 (CN) .......................... 2011 1 0153290

(51) Int. Cl.
| | | |
|---|---|---|
| H01L 21/762 | (2006.01) | |
| H01L 29/06 | (2006.01) | |
| H01L 29/66 | (2006.01) | |
| H01L 29/78 | (2006.01) | |

(52) U.S. Cl.
CPC ...... *H01L 29/0649* (2013.01); *H01L 21/76283* (2013.01); *H01L 29/6659* (2013.01); *H01L 29/66636* (2013.01); *H01L 29/7833* (2013.01)

(58) Field of Classification Search
CPC .................. H01L 21/76281; H01L 21/76283; H01L 21/823418; H01L 21/823814; H01L 21/7621; H01L 21/762; H01L 21/76205; H01L 21/76224; H01L 21/76232; H01L 21/76229; H01L 21/76235; H01L 29/66636; H01L 21/823821; H01L 21/823878
See application file for complete search history.

(56) References Cited

U.S. PATENT DOCUMENTS

| | | | | |
|---|---|---|---|---|
| 5,831,308 A | * | 11/1998 | Lee ................................ | 257/347 |
| 8,709,898 B2 | * | 4/2014 | Fukuda et al. ................ | 438/285 |
| 2009/0114956 A1 | * | 5/2009 | Tamura .......................... | 257/288 |
| 2012/0261760 A1 | * | 10/2012 | Haneda et al. ................ | 257/368 |
| 2013/0043515 A1 | * | 2/2013 | Huang et al. .................. | 257/288 |

FOREIGN PATENT DOCUMENTS

| | | |
|---|---|---|
| CN | 1070052 A | 3/1993 |
| CN | 1731569 | 2/2006 |
| EP | 1918998 A2 | 5/2008 |

OTHER PUBLICATIONS

Office Action from corresponding Chinese Patent Appl. No. 201110153290.X. dated Jun. 23, 2014.

* cited by examiner

*Primary Examiner* — Jose R Diaz
(74) *Attorney, Agent, or Firm* — Koppel, Patrick, Heybl & Philpott; Michael J. Ram

(57) ABSTRACT

A Si-on-half-insulator device and its manufacturing method are disclosed in this invention. In one embodiment, a horizontal insulating layer located below at least one of the source and drain regions is realized to reduce junction capacitance. In another embodiment, a horizontal insulating layer located below at least one of the source and drain regions and a vertical insulating layer located below at least one side surface of the gate are realized. The additional vertical insulating layer can reduce punch leakage. Further, a method of manufacturing the above semiconductor device is also disclosed, wherein the horizontal and vertical insulating layers are formed using an additional layer of epitaxially grown semiconductor material and isolating trenches.

23 Claims, 14 Drawing Sheets

SEMICONDUCTOR DEVICE AND MANUFACTURING METHOD THEREOF

CROSS-REFERENCE TO RELATED APPLICATIONS

This application claims priority to Chinese Patent Application No. 201110153290.X, filed on Jun. 9, 2011 and entitled "SEMICONDUCTOR DEVICE AND MANUFACTURING METHOD THEREOF", which is incorporated herein by reference in its entirety.

BACKGROUND OF THE INVENTION

1. Field of the Invention

The present invention relates to semiconductor device and manufacturing method thereof, and more particularly, to a semiconductor device on semi-SOI (silicon on insulator) and a manufacturing method thereof.

2. Description of the Related Art

One important property of high performance semiconductor devices is their conductivity. It has been known that current is inversely proportional to resistance. Traditionally, resistivity of an electronic device can be reduced, and therefore, current can be increased, through increasing sectional size of semiconductor material, shortening electron channel length, increasing voltage, or reducing resistivity of semiconductor material.

In order to manufacture integrated circuits (IC) having higher integration than those of the prior art, such as memory, logic circuit and the like, many efforts have been taken to further reduce the size of field effect transistors (FET), such as metal-oxide-semiconductor field effect transistors (MOSFET) and complementary metal oxide semiconductor field effect transistors (CMOS). Through decreasing the total size of a device and lowering operation voltage while maintaining electrical properties of the device, the device can be made more compact and its performance can be improved. Furthermore, in order to optimize various electrical properties of the device, the sizes of all elements in a device must be decreased in proportion at the same time.

However, with such smaller semiconductor devices, as shown in FIG. 4, source-drain junction parasitic capacitance is becoming larger. On the other hand, channel size may become smaller correspondingly, and therefore, source to drain punch leakage is more liable to occur. Moreover, for the downsized devices, the influence of short channel effects is more notable.

Therefore, there is need for a new semiconductor device.

SUMMARY OF THE INVENTION

According to a first aspect of the present invention, there is provided a semiconductor device, which may comprise: a gate on a substrate; source and drain regions located on opposite sides of the gate; a horizontal insulating layer substantially parallel to the surface of the substrate and arranged below at lease one of the source and drain regions.

Preferably, the device may further comprise a vertical insulating layer substantially vertical to the surface of the substrate and arranged below a side surface of the gate.

Preferably, the vertical insulating layer is lower than the source and drain regions.

Preferably, the device may further comprise isolating trenches arranged on one side of the source and drain regions far way from the gate.

Preferably, the horizontal insulating layer intersects with the isolating trenches.

Preferably, the horizontal insulating layer and the vertical insulating layer are in "└ " or "┘ " form.

According to a second aspect of the present invention, there is provided a method of manufacturing a semiconductor device, which may comprise the following steps: providing a substrate of a first semiconductor material, forming a protrusion with an expected height on the substrate, and providing a cap-shaped mask covering the top of the protrusion and its sidewalls; growing a layer of second semiconductor material on the substrate at opposite sides of the protrusion; removing a portion of the cap-shaped mask to expose the sidewalls of the protrusion; epitaxially growing the first semiconductor material on the second semiconductor material layer, such that the first semiconductor material grown is flush with the protrusion; removing the remaining portion of the mask; forming isolating trenches on the substrate such that the isolating trenches intersect with the second semiconductor material layer; selectively removing the second semiconductor material layer through the isolating trenches; forming a horizontal insulating layer at the location where the second semiconductor material layer is removed through the isolating trenches.

According to a third aspect of the present invention, there is provided a method of manufacturing a semiconductor device, which may comprise the following steps: providing a substrate of a first semiconductor material, forming a protrusion and providing a cap-shaped mask covering the top of the protrusion and its sidewalls; etching the substrate with a mask to an expected depth, so as to expose the sidewalls of a portion of the substrate below the protrusion; forming an insulating layer, the insulating layer having a vertical portion on a sidewall of the portion of the substrate and having a horizontal portion on the substrate at opposite sides of the protrusion; removing the horizontal portion of the insulating layer while removing a first part of the mask; epitaxially growing a horizontal layer of a second semiconductor material on the substrate at opposite sides of the protrusion; removing a second part of the mask to expose the sidewalls of the protrusion; selectively removing the vertical portion of the insulating layer; growing the first semiconductor material on the second semiconductor material layer so that the first semiconductor material grown is flush with the protrusion; removing a third part of the mask; forming insulting trenches such that the insulting trenches intersect with the second semiconductor material layer; selectively removing the second semiconductor material layer through the isolating trenches; forming a horizontal insulating layer at the location where the second semiconductor material layer is removed through the isolating trenches.

According to the third aspect of the present invention, preferably, after removing the second part of the mask to expose the sidewalls of the protrusion, the method may further comprise: using the vertical portion of the insulating layer as the vertical insulating layer; growing the first semiconductor material on the second semiconductor material layer such that the first semiconductor material grown is flush with the protrusion; forming the isolating trenches on the substrate to intersect with the second semiconductor material layer; removing the third part of the mask; selectively removing the second semiconductor material layer through the isolating trenches, and then forming a horizontal insulating layer at the location where the second semiconductor material layer is removed through the isolating trenches.

According to the second or the third aspect of the present invention, preferably, the mask comprises a first portion of the horizontal oxide insulating layer, a second portion of cap-shaped nitride insulting layer and a third portion of the horizontal oxide insulating layer.

According to the second or the third aspect of the present invention, preferably, the isolating trenches are filled after forming the horizontal insulating layer.

According to the second or the third aspect of the present invention, preferably, the horizontal insulating layer is formed with a thermal oxidization process through the isolating trenches.

According to the second or the third aspect of the present invention, preferably, after forming the horizontal insulating layer, the method further comprises the following steps: forming a gate on the generated structure; forming source and drain regions on opposite sides of the gate.

According to the second or the third aspect of the present invention, preferably, the method comprises forming the cap-shaped mask on the substrate, which may further comprise: forming an oxide insulating layer, a nitride insulating layer and an oxide insulating layer on the substrate in sequence; etching to form the protrusion on the substrate; depositing a nitride insulating layer; carrying out dry etch to remove the deposited nitride insulating layer while retaining the nitride insulating layer on the sidewalls of the protrusion, thereby forming the cap-shaped mask and the protrusion covered by the cap-shaped mask.

According to the second or the third aspect of the present invention, preferably, the first semiconductor material is Si and the second semiconductor material is SiGe.

According to the second aspect of the present invention, preferably, the expected height of the protrusion is the depth of the source and drain regions.

According to the third aspect of the present invention, preferably, the step of etching the substrate using a mask to the expected depth so as to expose the sidewalls of a portion of the substrate below the protrusion comprises: etching the substrate using the mask to the expected depth of the source or drain region.

According to the third aspect of the present invention, preferably, the horizontal and vertical layers are oxide insulating layers.

BRIEF DESCRIPTION OF THE DRAWINGS

The present invention will be better understood when reading the following detailed description with reference of drawings, and like references refer to similar elements, in which.

Note that, for conciseness and clarity, elements are not necessarily illustrated in proportion in those drawings. For example, for facilitating and improving clarity and understanding, some elements are enlarged in size with respect to others. Further, in those drawings, replicated references are used to denote corresponding or like elements.

DESCRIPTION OF THE EMBODIMENTS

Various specific embodiments of the present invention will now be described by way of examples with reference of drawings.

The First Embodiment

Figure 1A:
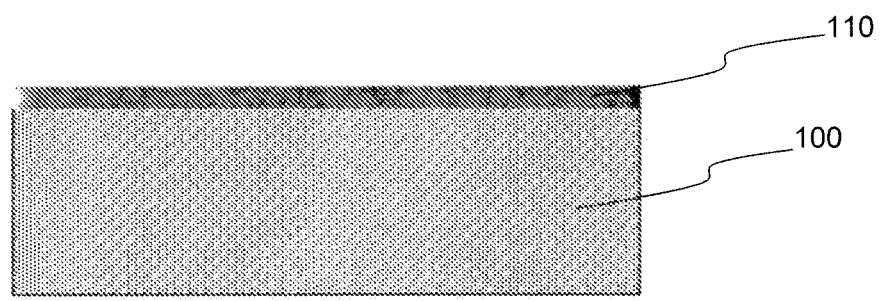
FIGS. 1A-1M schematically show the method of manufacturing a semiconductor device according to a first embodiment of this invention.
Figure 1B:
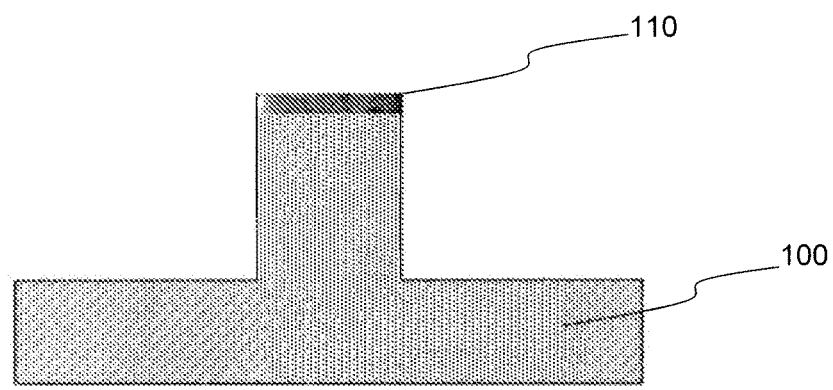

Referring to FIG. 1A, a semiconductor substrate 100 of a first semiconductor material is provided (hereinafter referred to as substrate 100 for short), and the first semiconductor material is for example Si. An oxide insulating layer 110 is formed on the substrate 100, which may be formed from, for example, $SiO_2$. Upon forming the structure shown in FIG. 1A, a photoresist is applied thereon, and the photoresist is patterned using a photomask (not shown) by photolithography, and then, as shown in FIG. 1B, the substrate 100 and the oxide insulating layer 110 are etched to form a protrusion with expected height in the substrate 100. As described below, the expected height will be the expected depth of the source and drain regions to be formed. Therefore, the expected height can be selected based on various applications by those skilled in the art after reading the teachings herein.

Figure 1C:
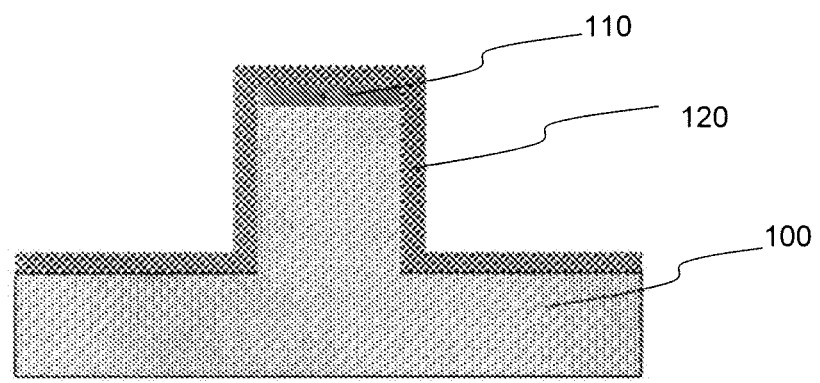

Next, as shown in FIG. 1C, a nitride insulating layer 120 is deposited on the semiconductor structure of FIG. 1B. The nitride insulating layer 120 may be formed by, for example, SiN. Obviously, any other suitable oxides, nitrides and/or combinations thereof can be used by those skilled in the art for the oxide insulating layer 110 and the nitride insulating layer 120 herein.

Figure 1D:
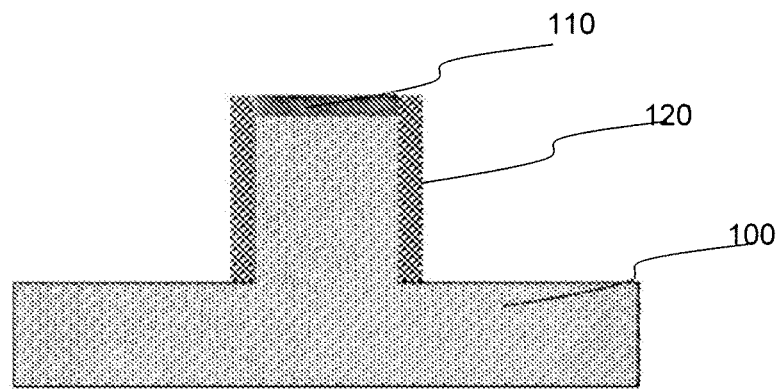

As shown in FIG. 1D, portions of the nitride insulating layer 120 located on the top of and opposite sides of the protrusion are removed through selective etching, so as to form a cap-shaped insulating layer covering the top and sidewalls of the protrusion which is consisted of the oxide insulating layer 110 and the nitride insulating layer 120. It will become clear from the following description that this cap-shaped insulating layer will be used as a mask.

Figure 1E:
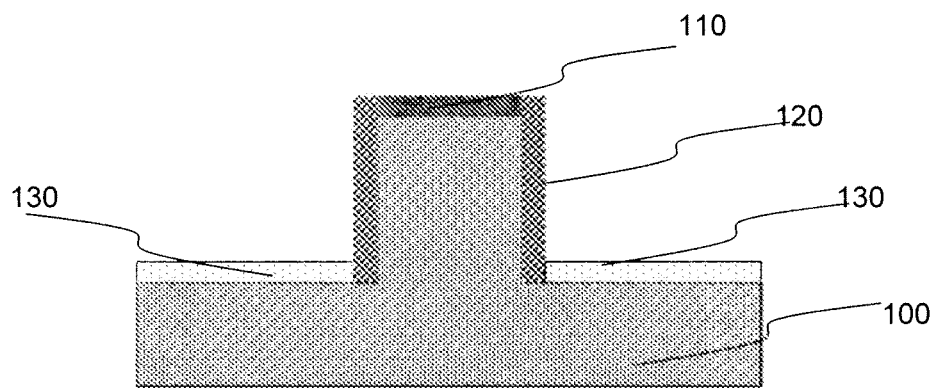

As shown in FIG. 1E, a second semiconductor material layer 130 is grown on the substrate 100 of the first semiconductor material. Herein, the second semiconductor material is, for example, SiGe. Although the first semiconductor material is specified as Si and the second semiconductor material is specified as SiGe by way of example, those skilled in the art will appreciate, however, any other semiconductor materials can be adopted so long as they are capable of epitaxial growth with each other. For example, the first semiconductor material can be SiGe or Ge, and the second semiconductor material can be Si. As discussed below, the thickness of the finally formed insulating layer is determined by the thickness of the second semiconductor material 130. Hence, those skilled in the art can select the thickness of the second semiconductor material layer 130 to achieve expected effects. In one embodiment, the second semiconductor material layer 130 can be 5-500 nm thick.

Figure 1F:
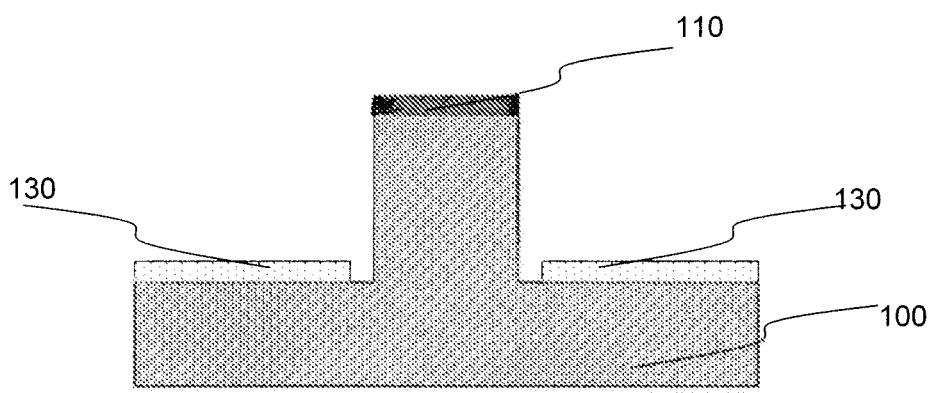

Next, as shown in FIG. 1F, the residual of the nitride insulating layer 120 is removed through, for example, wet etching, so as to expose the sidewalls of the protrusion.

Figure 1G:
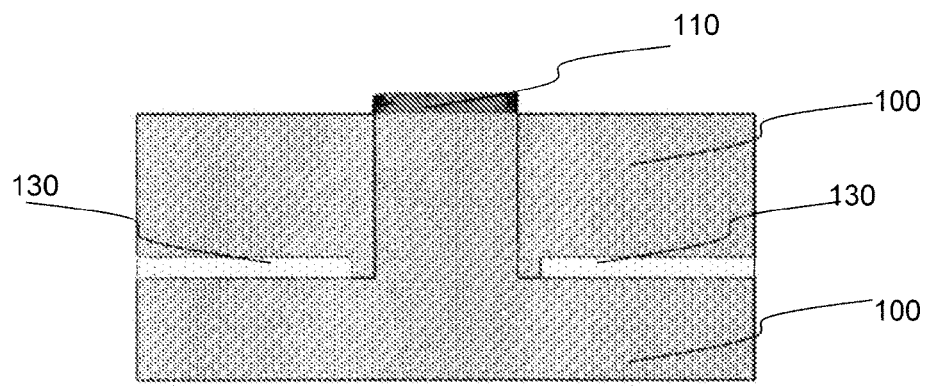

Referring to FIG. 1G, the first semiconductor material is epitaxially grown on the structure shown in FIG. 1F such that the first semiconductor material grown is flush with the protrusion.

Figure 1H:
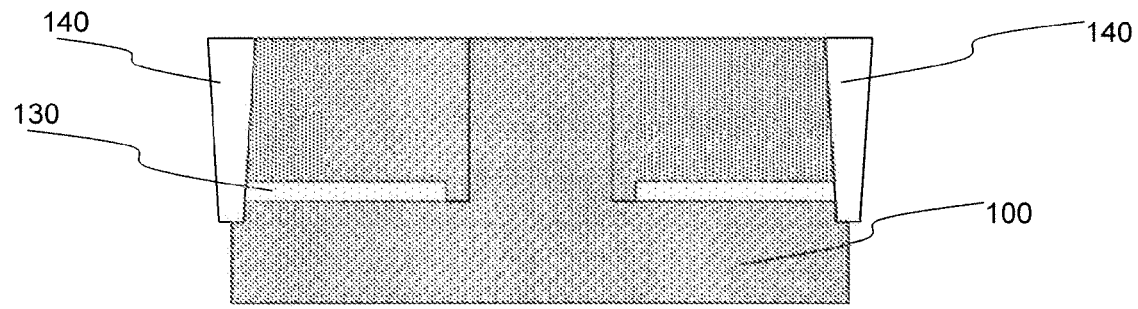

Referring to FIG. 1H, the oxide insulating layer 110 is removed from the semiconductor structure of FIG. 1F. For example, the oxide insulating layer 110 can be removed through dry etching. Next, isolating trenches 140 are formed on both sides of the semiconductor structure, which can be used for forming Shallow Trench Isolation (STI). As known by those skilled in the art, STI is usually used to isolate multiple devices on a single semiconductor substrate. In this invention, the depth of the isolating trenches 140 is selected so that they can intersect with the second semiconductor material layer 130.

Figure 1I:
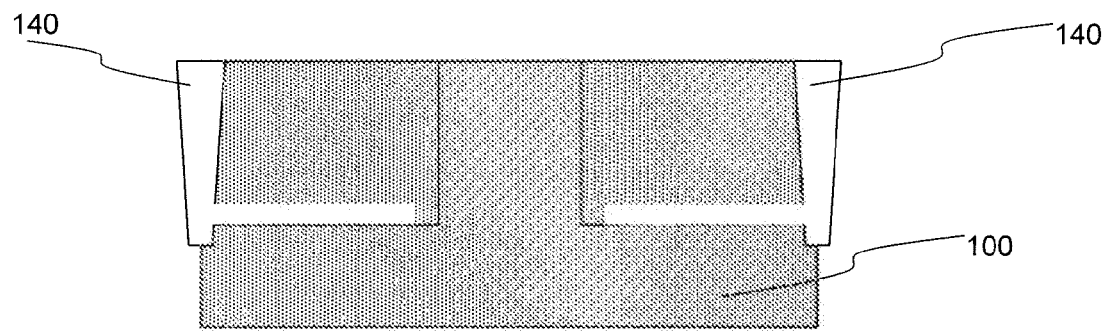

In FIG. 1I, an etchant is introduced through the isolating trenches 140 and the second semiconductor material layer 130 is selectively etched off. For example, the second semiconductor material layer 130 of SiGe can be removed through wet etching.

Figure 1J:
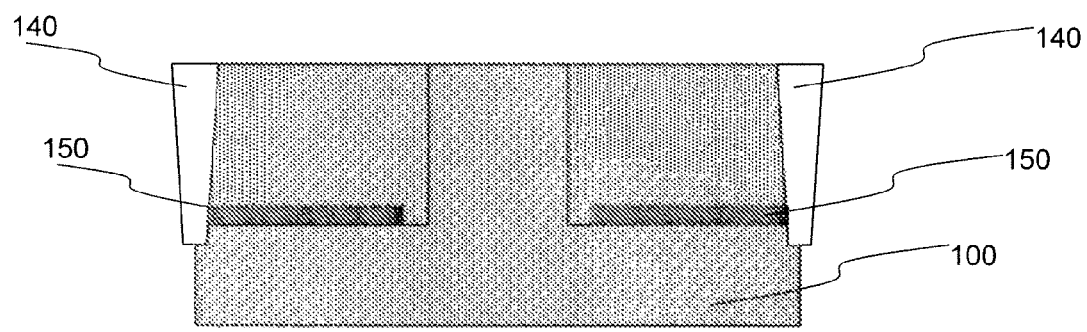

In FIG. 1J, a horizontal insulating layer 150 is formed through thermal oxidization at the position where the semiconductor material layer 130 originally existed. As mentioned above, the thickness of the horizontal insulating layer 150 depends on the grown thickness of the original second semiconductor material layer 130. Therefore, as described below, those skilled in the art can select the thickness of the horizontal insulating layer 150 to achieve expected benefit effects.

Figure 1K:
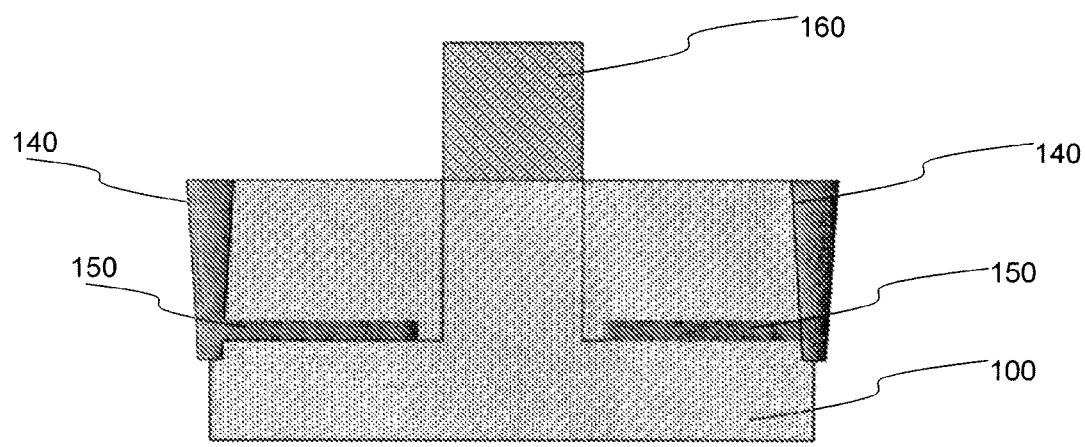

Referring to FIG. 1K, as known by those skilled in the art, the isolating trenches 140 are filled, and a gate 160 and a gate insulating layer (not shown) are formed on the resulting semiconductor structure.

Figure 1L:
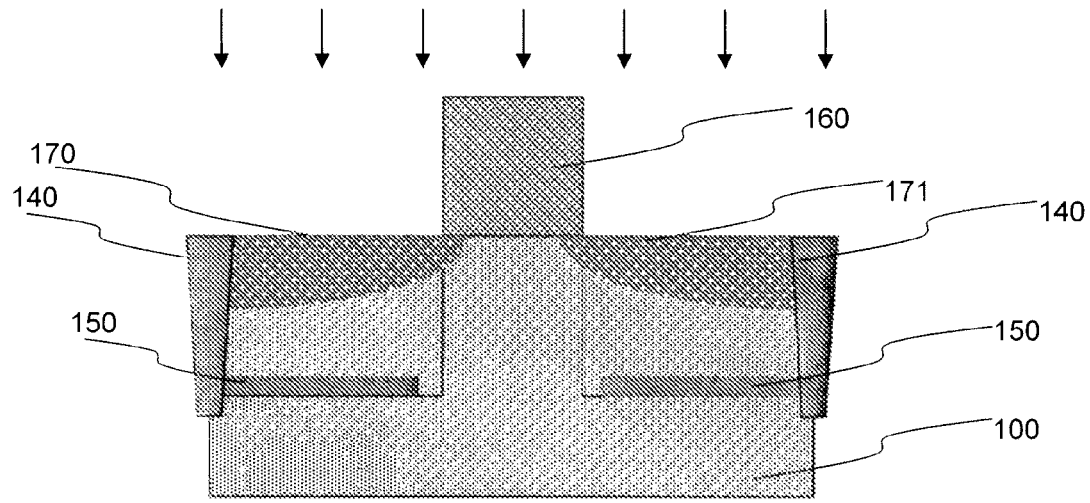

As shown in FIG. 1L, LDD lightly doping is carried out using the gate 160 as a mask.

Figure 1M:
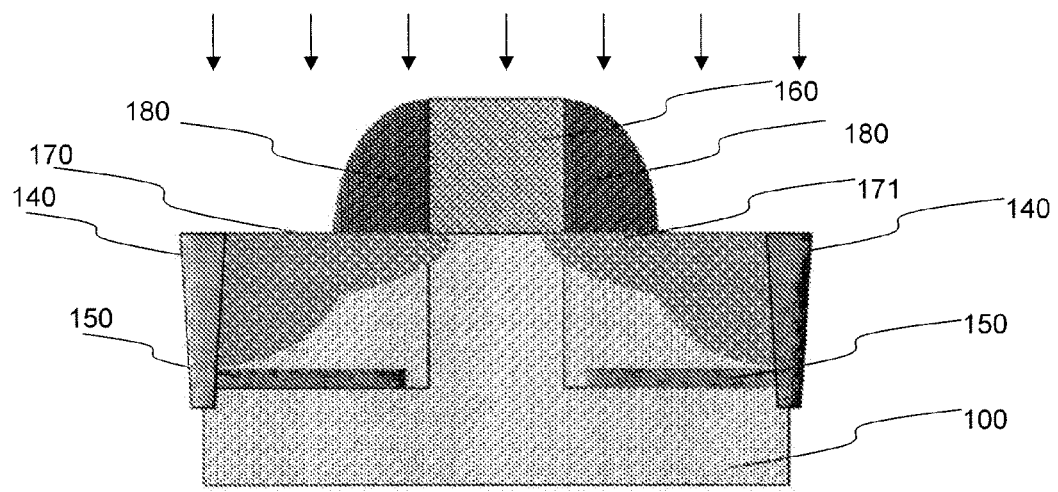

As shown in FIG. 1M, spaces 180 are formed on opposite sides of the gate 160, and a further source/drain doping is carried out to accomplish the manufacture of the device.

It will be appreciated that the present embodiment focuses on the process and method of forming a horizontal insulating layer in a semiconductor device. For conciseness, one or more steps that are not relative to the subject of this invention are simply described or omitted. However, those skilled in the art can fully understand how to form a horizontal insulating layer in a semiconductor substrate through the disclosure and teachings herein.

As the semiconductor device shown in FIG. 1M, since the insulating layer has a dielectric constant smaller than Si, the horizontal insulating layer 150 between the source region 170, the drain region 171 and a portion of the substrate is helpful to reduce parasitic junction capacitance. Since the horizontal insulating layer 150 does not extend through the whole substrate, but are located below the source region 170 and the drain region 171 respectively, this device thus is so-called "semi-SOI" device.

FIG. 1M shows the preferred embodiment of this invention. Those skilled in the art will appreciate the horizontal insulating layer 150 only need to be located below one of the source region 170 and the drain region 171, the reduced the junction capacitance between the corresponding region and the substrate 100 can be achieved. With respect to the process, consequently, at the step of FIG. 1E, the horizontal insulating layer 150 can be located only below the source region 170 or the drain region 171 through removing the second semiconductor material layer 130 on the corresponding side in photolithography. According to this invention, the object of this invention, that is, to reduce parasitic junction capacitance between the source or drain region and the substrate, can be achieved, even if the horizontal insulating layer 150 is only formed on one side of the protrusion.

The Second Embodiment

The second embodiment of this invention will be described with reference to FIGS. 2A-2Q.

Figure 2A:
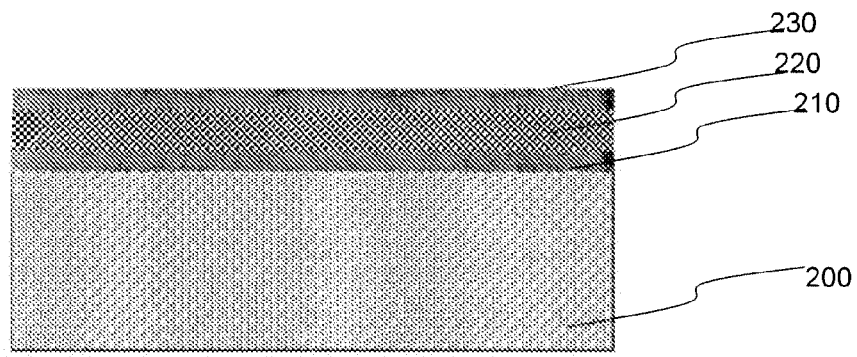
FIGS. 2A-2Q schematically show the method of manufacturing a semiconductor device according to a second embodiment of this invention.

As shown in FIG. 2A, a semiconductor substrate 200 of a first semiconductor material is provided (hereinafter called as substrate 200), the first semiconductor material may be, for example, Si. An oxide insulating layer 210, a nitride insulating layer 220 and an oxide insulating layer 230 are formed in sequence on the substrate 200. It will be appreciated that the oxide insulating layer 210, nitride insulating layer 220 and oxide insulating layer 230 herein can be formed by any suitable oxides and nitrides. For example, the oxide insulating layers 210 and 230 can be formed by, for example, $SiO_2$. The nitride insulating layer 220 can be formed by, for example, SiN. Obviously, those skilled in the art can use any other suited oxides, nitrides and/or combinations thereof to realize the oxide insulating layer 210, nitride insulating layer 220 and oxide insulating layer 230.

Upon forming the structure shown in FIG. 2A, a photoresist is applied thereon and is patterned through photolithography using a photomask (not shown), then the semiconductor structure shown in FIG. 2A is etched, as such a protrusion having an expected height is formed on the substrate 200. Upon the etching, portions of the substrate 200 are exposed on both sides of the protrusion, and the oxide insulating layer 210, nitride insulating layer 220 and oxide insulating layer 230 are located on top of the protrusion, as shown in FIG. 2B.

Figure 2B:
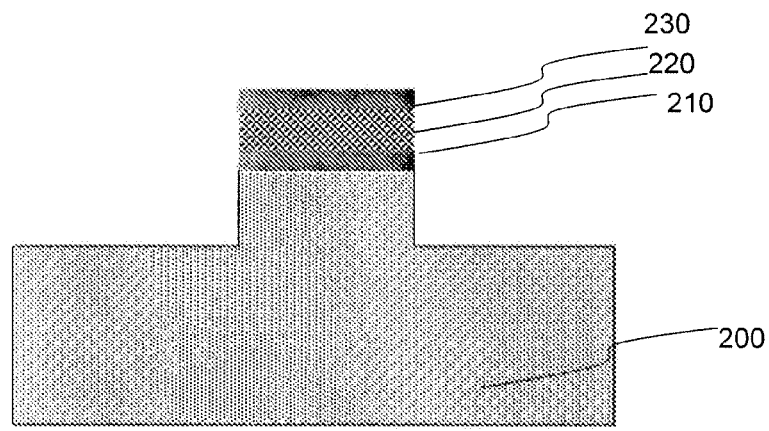
Figure 2C:
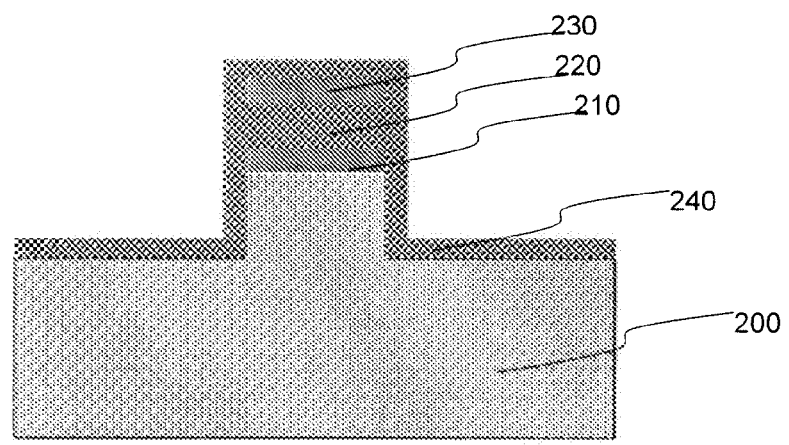

Next, referring to FIG. 2C, a nitride insulating layer 240 is deposited on the structure of FIG. 2B. As shown in FIG. 2C, the nitride insulating layer 240 covers the exposed portions of the substrate, as well as the protrusion.

Figure 2D:
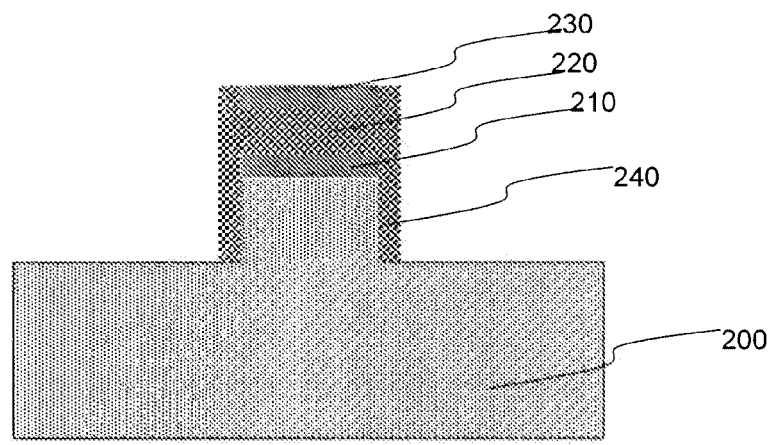

In FIG. 2D, a portion of the nitride insulating layer 240 located on the top of and opposite sides of the protrusion is removed through dry etching, so as to maintain portions of nitride insulating layer 240 covering the sidewalls of the protrusion. In FIG. 2D, a cap-shaped structure covering the protrusion is formed. As will be clear in connection with the following description, the cap-shaped structure will be used as a mask.

Figure 2E:
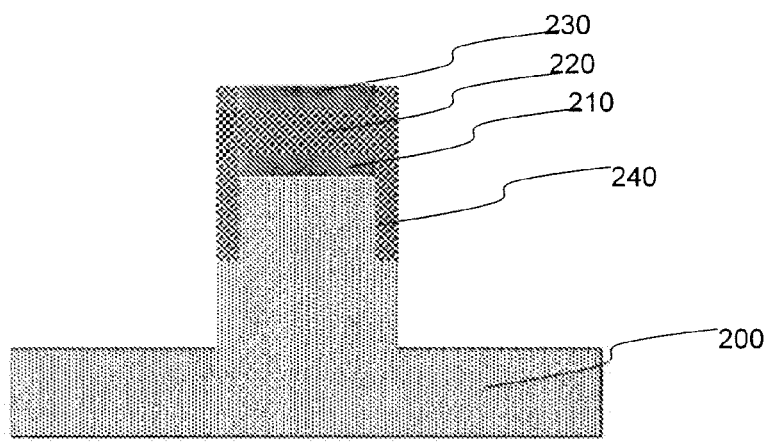

As shown in FIG. 2E, the substrate 200 is further etched to an expected depth using the cap-shaped structure in FIG. 2D as a mask, thus the sidewalls of portions of the substrate 200 located below the protrusion are exposed. As will be clear in connection with the following description, the distance from the substrate surfaces on opposite sides of the protrusion after etching to the top surface of the protrusion will become the depth of the source and drain regions. Therefore, those skilled in the art can select the depth to be etched in FIGS. 2B and 2E based on various applications, thereby selecting the depth of the source and drain regions.

Figure 2F:
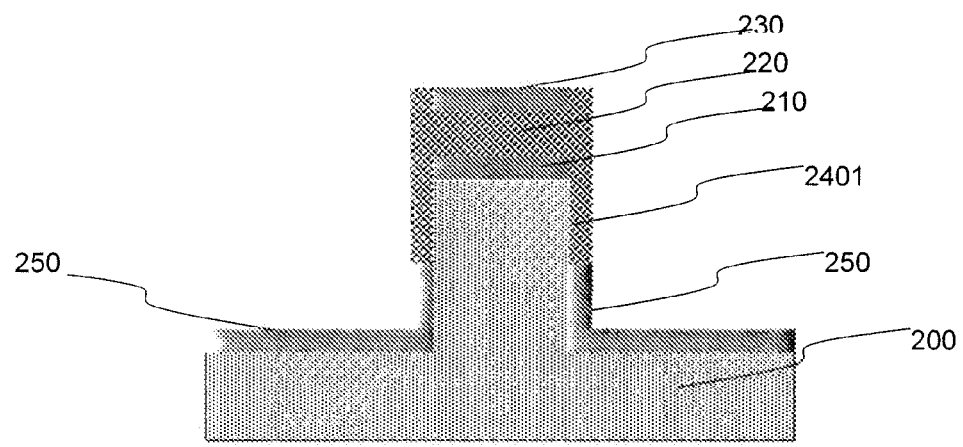

As shown in FIG. 2F, an oxide layer 250 is formed on the exposed surface of the substrate and the substrate surfaces on opposite sides of the protrusion through thermal oxidization. As shown, the oxide layer 250 includes vertical portions located on the exposed substrate sidewalls and horizontal portions located on the substrate on opposite sides of the protrusion.

Figure 2G:
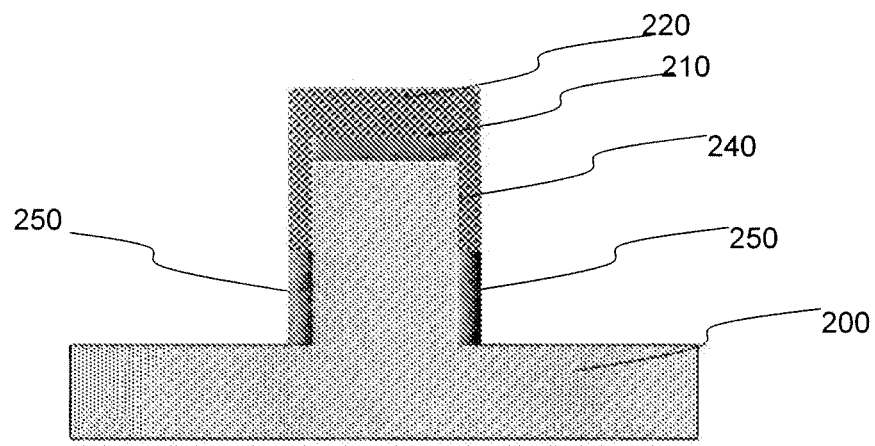

As shown in FIG. 2G, the horizontal portions of the oxide insulating layer 250 and a portion of the oxide insulating layer 230 located on top of the protrusion are selectively etched off. Upon etching to remove the oxide insulating layer 250 on opposite sides of the protrusion, a part of substrate 200 is exposed on both sides of the protrusion. Preferably, the oxide insulating layers 230 and 250 have the same composition. Thereby, they can be removed simultaneously in one etching step.

Figure 2H:
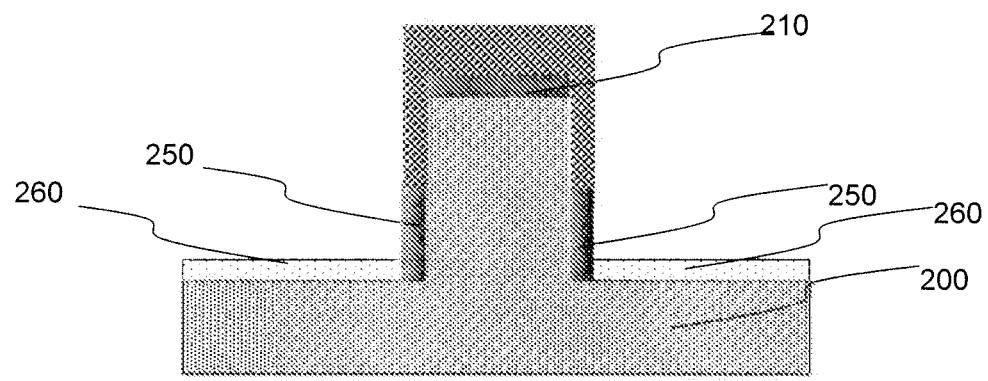

As shown in FIG. 2H, a second semiconductor material layer 260 is epitaxially grown on the exposed portions of the substrate 200. Herein, the second semiconductor material can be, for example, SiGe. As will be clear in connection with the following description, the thickness of the second semiconductor material layer 260 grown will determine the thickness of the horizontal insulating layer to be formed later. Therefore, those skilled in the art can select the thickness of the second semiconductor material layer 260 to be grown, so as to meet different application requirements.

Figure 2I:
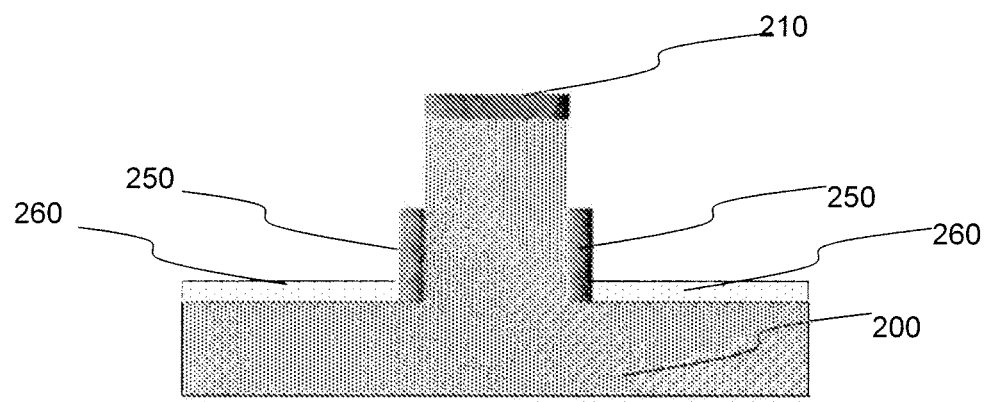

As shown in FIG. 2I, nitride insulating layers of the cap-shaped mask are selectively removed, for example, the nitride insulating layers 240 and 220 of the cap-shaped mask are etched away. Preferably, the nitride insulating layers 240 and 220 have the same composition, and can be removed simultaneously in one etching step.

Figure 2J:
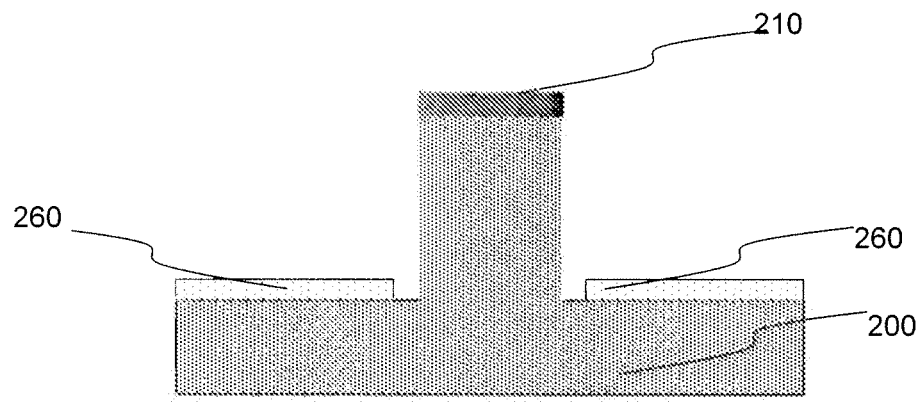

As shown in FIG. 2J, based on the semiconductor structure of FIG. 2I, the vertical oxide insulating layer 250 is selectively removed through wet etching. After the steps of FIGS. 2I and 2J, the sidewalls of the protrusion of the substrate are exposed.

Figure 2K:
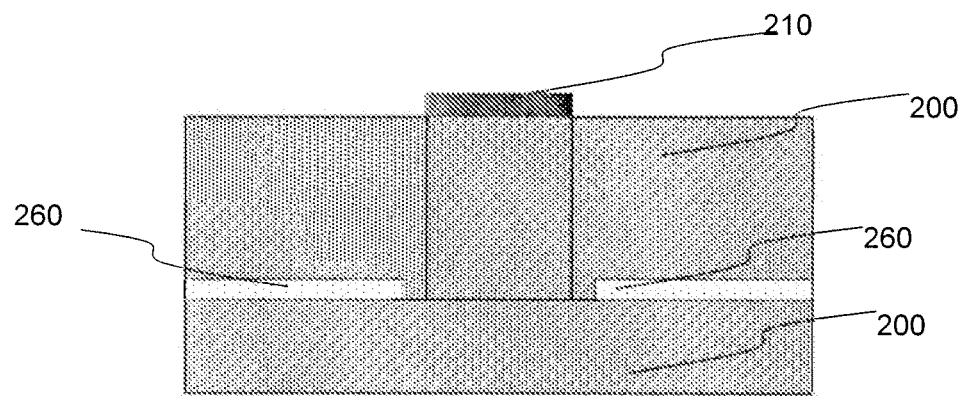

As shown in FIG. 2K, a first semiconductor material is epitaxially grown on the semiconductor structure of FIG. 2J such that the first semiconductor material grown is flush with the protrusion. As mentioned before, the first semiconductor material can be, for example, Si.

Figure 2L:
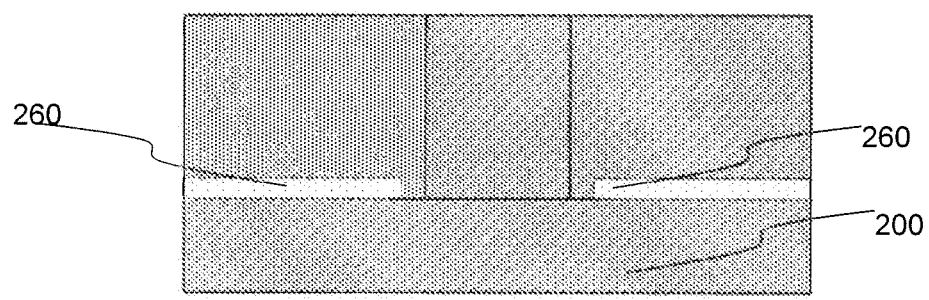

As shown in FIG. 2L, the last part of the cap-shaped mask, i.e., the oxide insulating layer 210 of the cap-shaped mask, is removed.

Figure 2M:
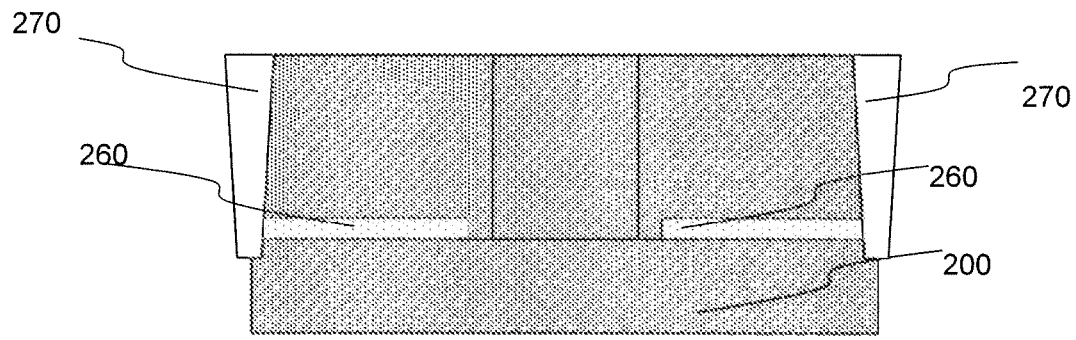

Next, as shown in FIG. 2M, isolating trenches 270 are formed on opposite sides of the resultant semiconductor structure. In this invention, the depth of the isolating trenches 270 is selected so that isolating trenches 270 can intersect with the second semiconductor material layer 260.

Figure 2N:

In FIG. 2N, an etchant is introduced through the isolating trenches 270 to selectively etch off the second semiconductor material layer 260. For example, the second semiconductor material layer 260 formed of, for example SiGe, can be removed through wet etching.

Figure 2O:
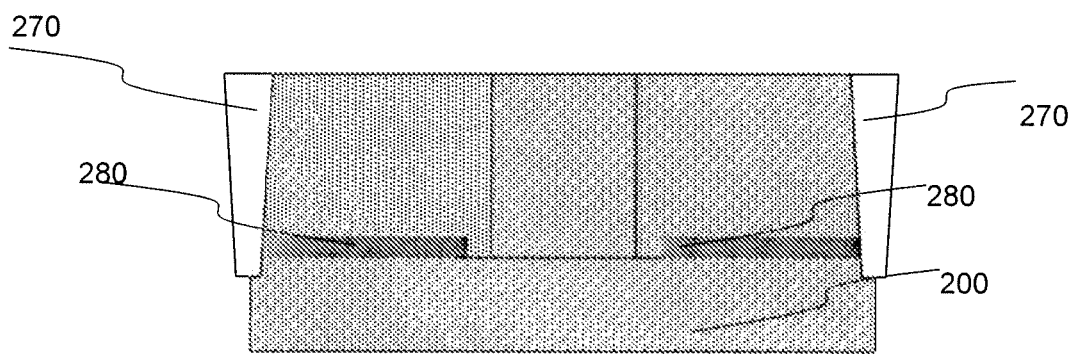

In FIG. 2O, a horizontal insulating layer 280 is formed at the position where the semiconductor material layer 260 originally existed through thermal oxidization. As mentioned above, the thickness of the horizontal insulating layer 280 is determined by the grown thickness of the original second semiconductor material layer 260. Therefore, those skilled in the art can select the thickness of the horizontal insulating layer 280 to achieve expected benefit effects.

Figure 2P:
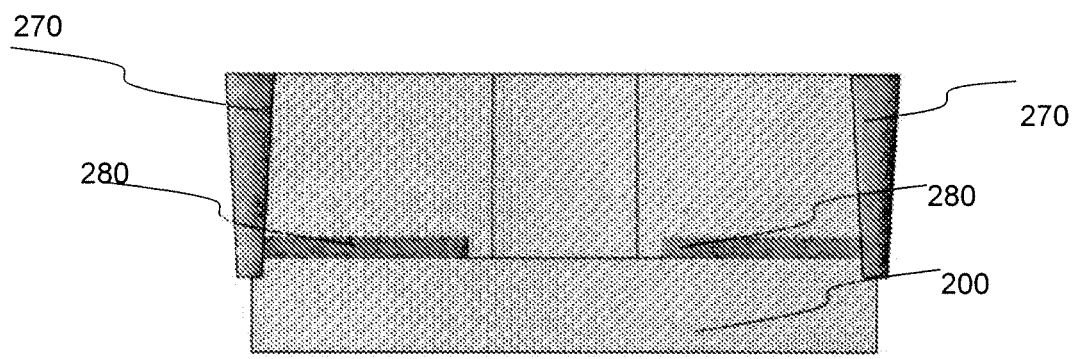

Referring to FIG. 2P, isolating trenches 270 are filled as known by those skilled in the art.

Figure 2Q:
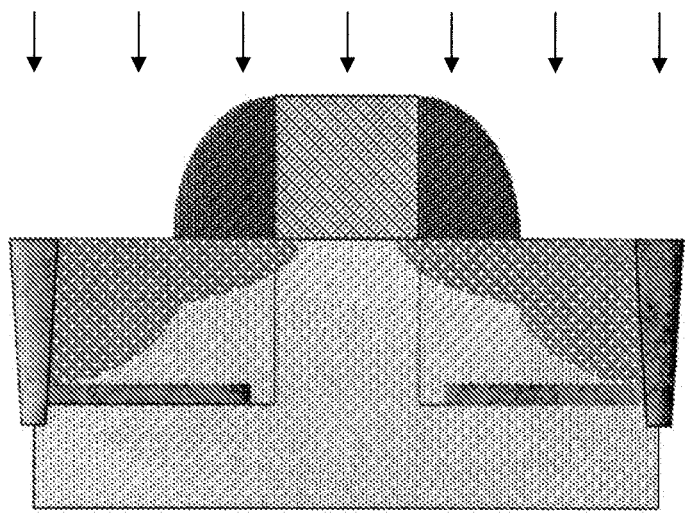

As shown in FIG. 2Q, a gate and a gate insulating layer (not shown) are formed on the resultant semiconductor structure. Source and drain regions are formed on opposite sides of the gate through doping. The above steps are similar to those shown in FIGS. 1K-1M, and are not repeated herein.

Similar to the first embodiment, the second embodiment also provides a method of manufacturing semi-SOI. Similarly, the preferable implementation of this invention is shown in FIG. 2Q. Those skilled in the art can fully appreciate that the horizontal insulating layer 280 only needs to be located below one of the source and drain regions, then the corresponding junction capacitance can be reduced. With respect to its process, consequently, at the step of FIG. 2G, the horizontal insulating layer 280 can be only located below one of the source region and the drain region through removing the second semiconductor material layer 260 grown on the corresponding one side of the protrusion by photolithography or the like. According to this invention, the object of this invention, that is, to reduce parasitic capacitance, can be achieved, even if the horizontal insulating layer 280 is only formed on one side of the protrusion.

Further, since the expected depth of the source and drain regions can be selected in advance in the steps of FIGS. 2B and 2E, the relative positions of the horizontal insulating layer 280 with respect to the source and drain regions can be determined beforehand advantageously. This is very benefit for reducing junction capacitance. For example, the depth of the source and drain regions can be predetermined based on the doping process parameters thereof, and then the horizontal insulating layer can be formed before the formation of the source and drain regions according to the predetermined depth.

The Third Embodiment

The third embodiment of this invention will be described with reference to drawings.

The steps of the third embodiment are similar to those of the second embodiment up to FIG. 2I, which are not discussed in detail for conciseness.

Figure 3A:
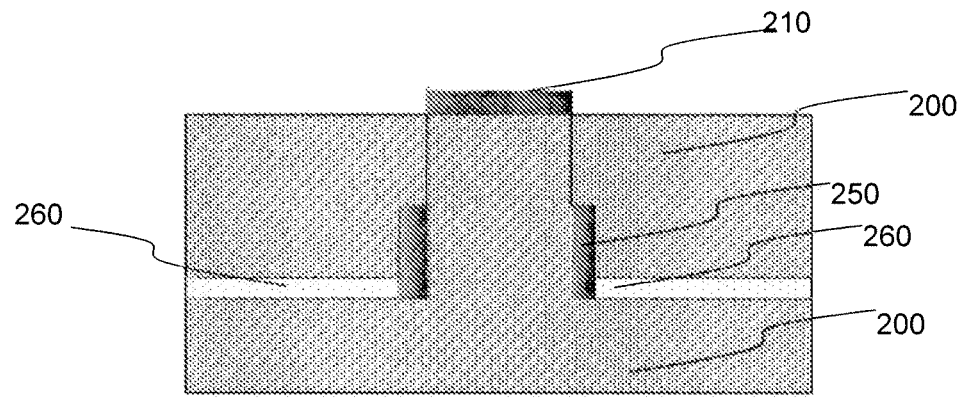
FIGS. 3A-3F schematically show the method of manufacturing a semiconductor device according to a third embodiment of this invention.

On the base of the structure of FIG. 2I, instead of removing the vertical portion of the oxide insulating layer 250 as shown in FIG. 2J, it is maintained as vertical insulating layer for later use. As shown in FIG. 3A, a first semiconductor material such as Si is grown on the second semiconductor material layer 260, such that the first semiconductor material grown is flush with the top of the protrusion of the substrate.

Figure 3B:
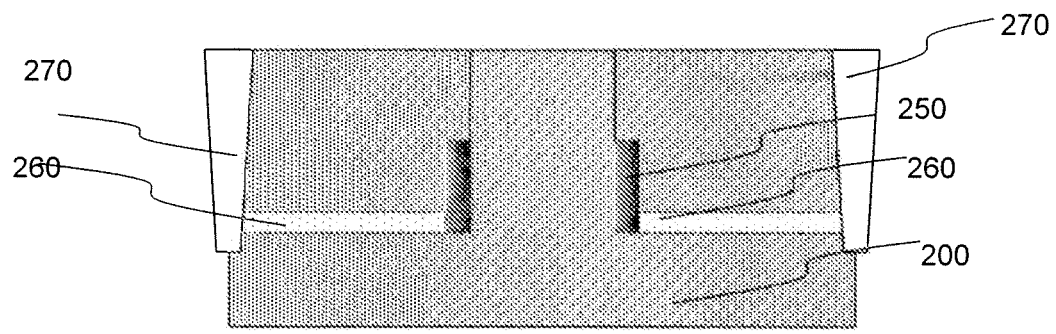

As shown in FIG. 3B, the last part of the cap-shaped mask, i.e., the oxide insulating layer 210 of the cap-shaped mask, is removed.

Figure 3C:
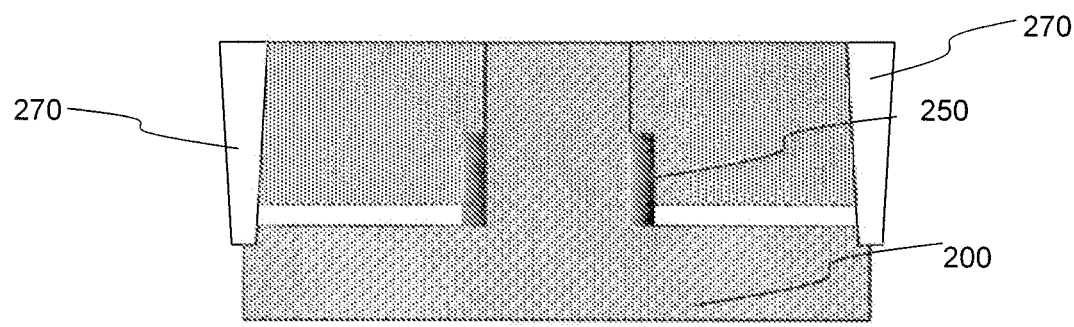

Next, as shown in FIG. 3C, isolating trenches 270 are formed on opposite sides of the resultant semiconductor structure. In this invention, the depth of the isolating trenches 270 is selected so that isolating trenches 270 can intersect with the second semiconductor material layer 260. Then, an etchant is introduced through the isolating trenches 270 to selectively etch off the second semiconductor material layer 260. For example, the second semiconductor material layer 260 formed of, for example SiGe, can be removed through wet etching.

Figure 3D:
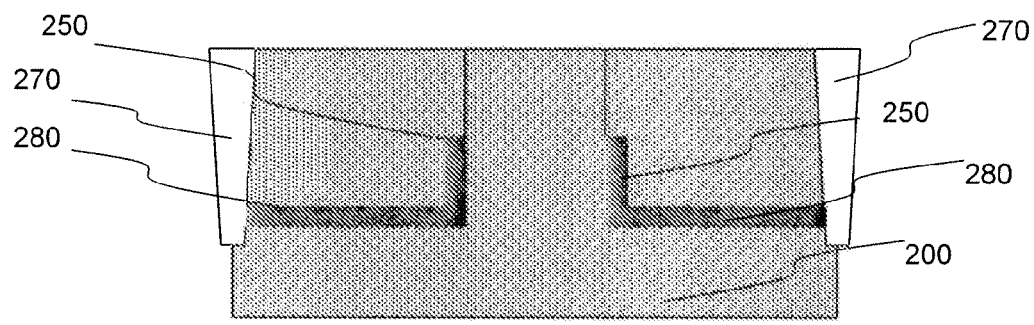

In FIG. 3D, a horizontal insulating layer 280 is formed at the position where the semiconductor material layer 260 originally existed through thermal oxidization. As mentioned above, the thickness of the horizontal insulating layer 280 is determined by the grown thickness of the original second semiconductor material layer 260. Therefore, those skilled in the art can select the thickness of the horizontal insulating layer 280 to achieve expected benefit effects.

Figure 3E:
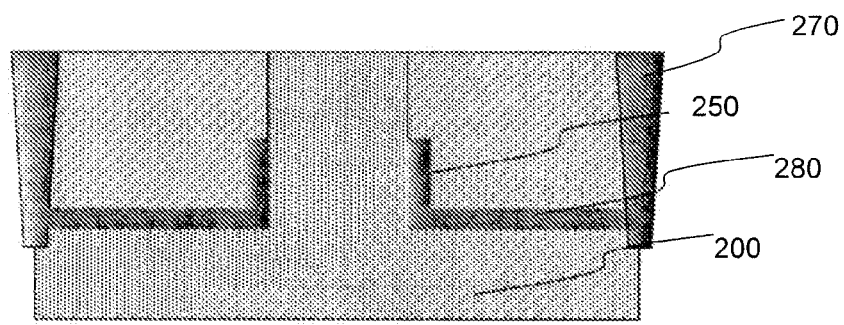

Referring to FIG. 3E, isolating trenches 270 are filled as known by those skilled in the art.

Figure 3F:
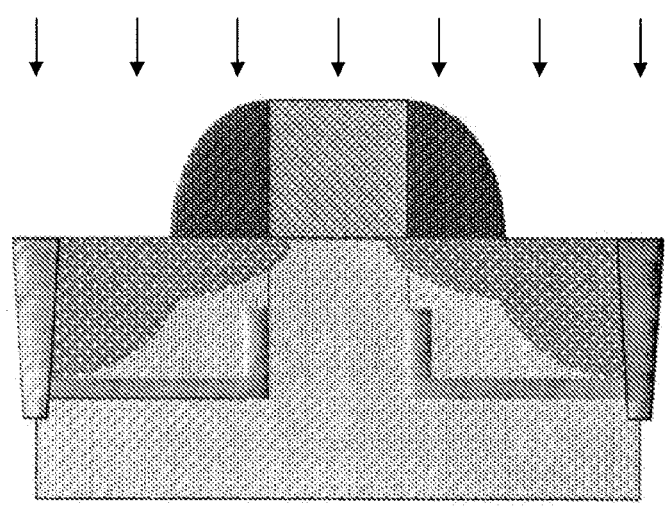
Figure 4:
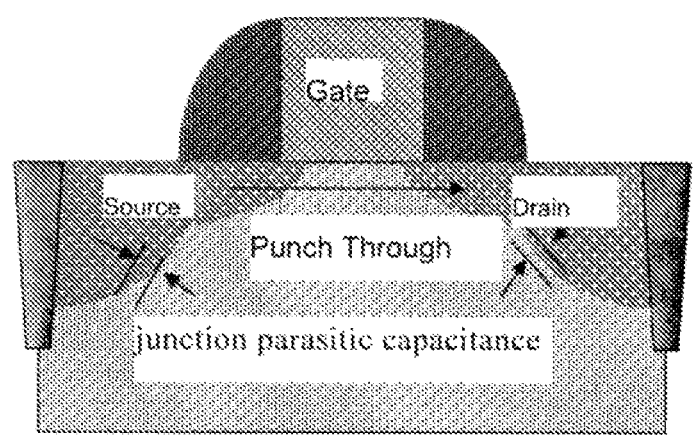
FIG. 4 shows a semiconductor device of the prior art.

As shown in FIG. 3F, a gate and a gate insulating layer (not shown) are formed on the obtained semiconductor structure. Source and drain regions are formed on opposite sides of the gate through doping. The above steps are similar to those shown in FIGS. 1K-1M, and are not repeated herein.

As shown in FIGS. 2B-2E, the distance from the vertical portion of the oxide insulating layer 250 to the substrate surface is determined by the depth to be etched on the substrate as shown in FIG. 2B. Therefore, the vertical insulating layer should be lower than the substrate surface. And those skilled in the art can select and determine the height of the vertical insulating layer, and thus, the resistance to punch leakage, based on different device performance. For example, the higher the vertical insulating layer is, the better effect of punch leakage prevention can be obtained. However, the vertical insulating layer should be lower than the substrate surface. In another embodiment, the vertical insulating layer can be lower than the source and drain regions.

According to the third embodiment of this invention, the vertical portion of the oxide insulating layer 250 is maintained. Therefore, in the substrate 200 is formed an insulating layer consisted of the vertical portion of the oxide insulating layer 250 and the horizontal insulating layer 280 in the form of "└" or "┘". Such a structure can obtain some technique effect benefits. For example, the vertical portion of the "└" or "┘" shaped insulating layer can greatly reduce punch leakage, and therefore improve performance of semiconductor devices. Furthermore, the horizontal portion of the "└" or "┘" shaped insulating layer can reduce parasitic capacitance between the source/drain region and the substrate.

The semiconductor device according to the third embodiment, as well as its manufacturing method, can alleviate the influence of short channel effects, and improve performance of semiconductor devices.

It will be appreciated that words "approximately" or "about" are used herein to mean that values or positions expressed with such words are expected to be very proximate to the specified values and positions. However, it is well known in the art that slight deviations present ubiquitously may prevent the precisely match therebetween. It is well known in the art that a deviation up to about 10% (and for semiconductor doping concentrate, up to 20%) is considered as a reasonable deviation of the idea target.

Further, although some oxide or nitride layers are shown as single layers in this specification and drawings, however, those skilled in the art will appreciate that a single or multiple oxide or nitride insulating layers can be selected based on specific applications, at this time, the process can be change consequently according to the components of the selected insulating layer(s).

Although preferable embodiment according to this invention have been described with reference to drawings, obviously, various modifications and changes can be made by those skilled in the art according to the previous description. Hence, all of such selections, modifications and changes that fall within the real scope and subject of this invention are covered by the attached claims.

The invention claimed is:

1. A method of manufacturing semiconductor device, comprising the following steps:
providing a substrate of a first semiconductor material, forming a protrusion with an expected height on the substrate, and providing a cap-shaped mask covering the top and sidewalls of the protrusion;
growing a layer of second semiconductor material on the surfaces of the substrate at opposite sides of the protrusion;
removing a portion of the cap-shaped mask to expose the sidewalls of the protrusion;
epitaxially growing the first semiconductor material on the second semiconductor material layer, such that the first semiconductor material grown is flush with the protrusion;
removing the remaining portion of the mask;
forming isolating trenches on the substrate such that the isolating trenches intersect with the grown second semiconductor material layer;
selectively removing the second semiconductor material layer through the isolating trenches;
forming a horizontal insulating layer at the location where the second semiconductor material layer is removed through the isolating trenches.

2. The method according to claim 1, wherein the isolating trenches are filled after forming the horizontal insulating layer.

3. The method according to claim 1, wherein the horizontal insulating layer is formed through the isolating trenches with a thermal oxidization process.

4. The method according to claim 1, wherein, after forming the horizontal insulating layer, the method further comprises the following steps:
forming a gate on the formed structure;
forming source and drain regions on opposite sides of the gate.

5. The method according to claim 1, wherein the first semiconductor material is Si and the second semiconductor material is SiGe.

6. The method according to claim 1, wherein the expected height of the protrusion is the depth of the source and drain regions.

7. A method of manufacturing semiconductor device, comprising the following steps:
providing a substrate of a first semiconductor material, forming a protrusion on the substrate and providing a cap-shaped mask covering the top and sidewalls of the protrusion;
removing the substrate with a mask to an expected depth, as so to expose the sidewalls of a portion of the substrate below the protrusion;
forming an insulating layer, the insulating layer having a vertical portion on a sidewall of the portion of the substrate and having a horizontal portion on the substrate at opposite sides of the protrusion;
removing the horizontal portion of the insulating layer while removing a first part of the mask;
epitaxially growing a horizontal layer of a second semiconductor material on the substrate at opposite sides of the protrusion;
removing a second part of the mask to expose the sidewalls of the protrusion;
selectively removing the vertical portions of the insulating layer;
growing the first semiconductor material on the second semiconductor material layer so that the grown first semiconductor material is flush with the protrusion;
removing a third part of the mask;
forming isolating trenches on the substrate such that the isolating trenches intersect with the second semiconductor material layer;
selectively removing the second semiconductor material layer through the isolating trenches, and forming, through the isolating trenches, a horizontal insulating layer at the location where the second semiconductor material layer is removed.

8. The method according to claim 7, wherein, after removing the second part of the mask to expose the sidewalls of the protrusion, the method further comprises:
using the vertical portion of the insulating layer as the vertical insulating layer;
growing the first semiconductor material on the second semiconductor material layer such that the grown first semiconductor material is flush with the protrusion;
forming the isolating trenches on the substrate such that the isolating trenches intersect with the second semiconductor material layer;
removing the third part of the mask;
selectively removing the second semiconductor material layer through the isolating trenches, and then forming through the isolating trenches a horizontal insulating layer at the location where the second semiconductor material layer is removed.

9. The method according to claim 8, wherein the mask comprises a first portion of a horizontal oxide insulating layer, a second portion of a cap-shaped nitride insulting layer and a third portion of the horizontal oxide insulating layer.

10. The method according to claim 8, wherein the isolating trenches are filled after forming the horizontal insulating layer.

11. The method according to claim 8, wherein the horizontal insulating layer is formed through the isolating trenches with a thermal oxidization process.

12. The method according to claim 8, wherein, after forming the horizontal insulating layer, the method further comprises the following steps:
    forming a gate on the formed structure;
    forming source and drain regions on opposite sides of the gate.

13. The method according to claim 8, comprising forming the cap-shaped mask on the substrate, which further comprises:
    forming an oxide insulating layer, a nitride insulating layer and an oxide insulating layer on the substrate in sequence;
    etching to form the protrusion on the substrate;
    depositing a nitride insulating layer;
    carrying out dry etch to remove the deposited nitride insulating layer while maintain the nitride insulating layer on the sidewalls of the protrusion, thereby forming the cap-shaped mask and the protrusion covered by the cap-shaped mask.

14. The method according to claim 8, wherein the first semiconductor material is Si and the second semiconductor material is SiGe.

15. The method according to claim 8, wherein the horizontal and vertical layers are oxide insulating layers.

16. The method according to claim 7, wherein the mask comprises a first portion of a horizontal oxide insulating layer, a second portion of a cap-shaped nitride insulting layer and a third portion of the horizontal oxide insulating layer.

17. The method according to claim 7, comprising forming the cap-shaped mask on the substrate, which further comprises:
    forming an oxide insulating layer, a nitride insulating layer and an oxide insulating layer on the substrate in sequence;
    etching to form the protrusion on the substrate;
    depositing a nitride insulating layer;
    carrying out dry etch to remove the deposited nitride insulating layer while maintain the nitride insulating layer on the sidewalls of the protrusion, thereby forming the cap-shaped mask and the protrusion covered by the cap-shaped mask.

18. The method according to claim 7, wherein the step of etching the substrate with a mask to the expected depth so as to expose the sidewalls of a portion of the substrate below the protrusion comprises:
    removing the substrate using the mask to the desired depth of the source or drain region.

19. The method according to claim 7, wherein the horizontal and vertical layers are oxide insulating layers.

20. The method according to claim 7, wherein the isolating trenches are filled after forming the horizontal insulating layer.

21. The method according to claim 7, wherein the horizontal insulating layer is formed through the isolating trenches with a thermal oxidization process.

22. The method according claim 7, wherein, after forming the horizontal insulating layer, the method further comprises the following steps:
    forming a gate on the formed structure;
    forming source and drain regions on opposite sides of the gate.

23. The method according to claim 7, wherein the first semiconductor material is Si and the second semiconductor material is SiGe.

* * * * *